(12) United States Patent
Vimercati

(10) Patent No.: US 10,083,731 B2
(45) Date of Patent: Sep. 25, 2018

(54) MEMORY CELL SENSING WITH STORAGE COMPONENT ISOLATION

(71) Applicant: Micron Technology, Inc., Boise, ID (US)

(72) Inventor: Daniele Vimercati, El Dorado Hills, CA (US)

(73) Assignee: MICRON TECHNOLOGY, INC, Boise, ID (US)

( * ) Notice: Subject to any disclaimer, the term of this patent is extended or adjusted under 35 U.S.C. 154(b) by 0 days.

(21) Appl. No.: 15/067,954

(22) Filed: Mar. 11, 2016

(65) Prior Publication Data

US 2017/0263304 A1 Sep. 14, 2017

(51) Int. Cl.
*G11C 11/22* (2006.01)

(52) U.S. Cl.
CPC .......... *G11C 11/2273* (2013.01); *G11C 11/22* (2013.01)

(58) Field of Classification Search
CPC ... G11C 11/221; G11C 11/22; G11C 11/2273; G11C 11/2275; G11C 14/0072; G11C 11/4091; G11C 11/5657; G11C 11/1673; G11C 11/225; G11C 11/4094; G11C 11/413; G11C 11/419; G11C 11/409; G11C 11/5607

See application file for complete search history.

(56) References Cited

U.S. PATENT DOCUMENTS

| | | | |
|---|---|---|---|
| 6,023,438 A * | 2/2000 | Tanaka | G11C 11/22 365/145 |
| 6,804,140 B2 | 10/2004 | Lin et al. | |
| 6,898,104 B2 | 5/2005 | Ogiwara et al. | |
| 6,917,551 B2 | 7/2005 | Jeong | |
| 8,018,754 B1 | 9/2011 | Evans et al. | |
| 8,780,664 B2 | 7/2014 | Choi | |
| 2001/0054165 A1 * | 12/2001 | Ono | G11C 29/789 714/718 |
| 2012/0170348 A1 * | 7/2012 | Clinton | G11C 11/22 365/145 |

OTHER PUBLICATIONS

ISA/EPO, International Search Report and Written Opinion of the International Searching Authority, Int'l Appl. No. PCT/US2017/020687, dated Jun. 15, 2017, Korean Intellectual Property Office, Seo-gu, Daejeon, Republic of Korea, 12 pgs.

* cited by examiner

*Primary Examiner* — Uyen B Tran
(74) *Attorney, Agent, or Firm* — Holland & Hart LLP

(57) ABSTRACT

Methods, systems, and devices for operating a ferroelectric memory cell or cells are described. A ferroelectric memory cell may be selected using a selection component that is in electronic communication with a sense amplifier and a ferroelectric capacitor of a ferroelectric memory cell. A voltage applied to the ferroelectric capacitor may be sized to increase the signal sensed during a read operation. The ferroelectric capacitor may be isolated from the sense amplifier during the read operation. This isolation may avoid stressing the ferroelectric capacitor which may otherwise occur due to the applied read voltage and voltage introduce by the sense amplifier during the read operation.

18 Claims, 8 Drawing Sheets

MEMORY CELL SENSING WITH STORAGE COMPONENT ISOLATION

BACKGROUND

The following relates generally to memory devices and more specifically to memory cell sensing with storage component isolation.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. FeRAM performance may be further improved by increasing the signal extracted from the capacitors used in an FeRAM array. But increasing the signal extracted from the capacitors may stress the capacitors (e.g., via overcharging), which may damage the FeRAM.

BRIEF DESCRIPTION OF THE DRAWINGS

The disclosure herein refers to and includes the following figures.

DETAILED DESCRIPTION

Figure 1:
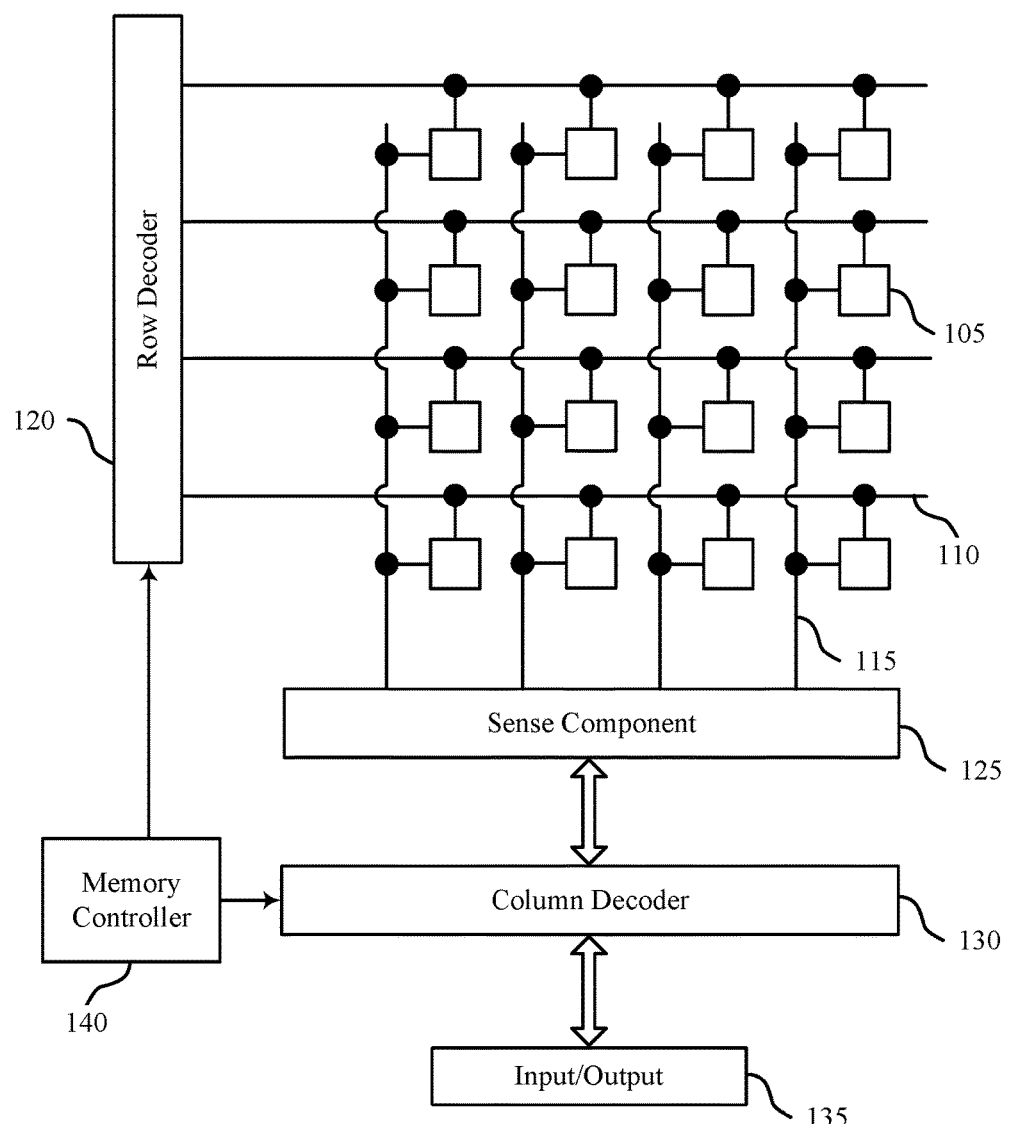
FIG. 1 illustrates an example memory array that supports memory cell sensing with storage component isolation in accordance with various embodiments of the present disclosure.

Memory cell sensing accuracy may be improved without stressing the cell by employing a sensing scheme that prevents memory cell capacitors from being overcharged. For example, a memory cell capacitor may be electrically isolated from a digit line of a memory cell array during a read operation, which may limit the voltage applied to the capacitor during the read operation and thus reduce the likelihood of overcharging.

Memory cells, including ferroelectric memory cells, within a memory array may be accessed by a word line and a digit line. Access may include writing to a cell (e.g., storing a logic state) or reading a cell (e.g., reading a stored logic state). Each cell may have a ferroelectric capacitor, or other storage component, that is used to store a logic value of the cell. A single digit line may connect multiple memory cells and may be connected to a sense amplifier that, when activated during a read operation, is used to determine the stored logic state of a memory cell. For example, an activated sense amplifier may compare the signal (e.g., voltage) extracted from the cell to a reference signal.

The greater the charge that is extracted from the cell, the larger the signal available to read to determine the stored state. A larger signal may increase read accuracy. The amount of charge extracted from a cell's capacitor may be increased by applying higher (e.g., boosted) voltages to a plate of a ferroelectric capacitor during read operations. But high plate voltages may make the capacitor more susceptible to overcharging when the sense amplifier is activated. For instance, due to a spike in voltage across the capacitor when the sense amplifier is activated and a boosted plate voltage, the total voltage across the capacitor may exceed a rated voltage threshold. In some cases the breakdown rating of the ferroelectric material may be exceeded, which may result in damage to the capacitor (e.g., via internal short-circuiting). A stressed capacitor may exhibit unpredictable behavior or suffer from reduced longevity. To avoid stressing the cell capacitor in such a way, the capacitor may be isolated from the digit line before the sense amplifier is activated.

As described below, a ferroelectric memory cell capacitor may be isolated from the digit line, and thus the sense amplifier, during a read operation. The capacitor may be isolated by deactivating a selection component (e.g., a transistor) of the memory cell, which may prevent charge-sharing by the digit line and the capacitor. Isolating the capacitor may allow for greater voltages to be used in the read operation without stressing the capacitor, and may thus allow for increased read accuracy with less concern about damaging or jeopardizing the memory cell.

Features of the disclosure introduced above are further described below in the context of a memory array. Specific examples are then described for memory cell sensing with storage component isolation. These and other features of the disclosure are further illustrated by and described with reference to apparatus diagrams, system diagrams, and flowcharts that relate to storage component isolation during a read operation.

FIG. 1 illustrates an example memory array 100 that supports memory cell sensing with storage component isolation in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, a memory cell 105 is configured to store more than two logic states. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties, and some details and advantages of a ferroelectric memory cell 105 are discussed below.

Operations such as reading and writing may be performed on memory cells 105 by activating or selecting the appropriate word line 110 and digit line 115. Activating or selecting a word line 110 or a digit line 115 may include applying a voltage potential to the respective line. In some cases, a digit line 115 may be referred to as a bit line. Word lines 110 and digit lines 115 may be made of conductive materials. In some examples, word lines 110 and digit lines 115 are made of metals (e.g., copper, aluminum, gold, tungsten, etc.). According to the example of FIG. 1, each row of memory cells 105 are connected to a single word line 110, and each column of memory cells 105 are connected to a single digit line 115. By activating one word line 110 and one digit line 115, a single memory cell 105 may be accessed at their intersection. The intersection of a word line 110 and digit line 115 may be referred to as an address of a memory cell.

In some architectures, the storage component of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105. In some cases, a word line 110 may be deactivated during a read operation after a specific memory cell 105 has been selected for the read operation. As described in further detail below, this technique may prevent stress on the memory cell 105 by isolating a storage component (e.g., a capacitor) of the memory cell 105 from its corresponding digit line 115 before the digit line voltage is modified by the activation of the sense component 125.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed.

Upon accessing, a memory cell 105 may be read, or sensed, by sense component 125. For example, sense component 125 may compare a signal (e.g., a voltage) of the relevant digit line 115 to a reference signal (not shown) in order to determine the stored state of the memory cell 105. If digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. In some cases, sense component 125 may include or be referred to as a sense amplifier. The detected logic state of memory cell 105 may then be output through column decoder 130 as output 135. The performance of the sense component 125 may be more accurate when the difference between the signals that represent the stored states of a memory cell 105 is large. A sensing scheme may thus be employed that increases the difference between the signals that corresponding to the stored states of a memory cell 105.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second may be employed for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery.

Ferroelectric memory cells may, however, have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate. Additionally, employing sensing schemes described herein in which larger signal are used for sensing may allow memory cell 105 size to be reduced, which in turn may allow for reduced power consumption relative to other arrays employing other sensing schemes.

The memory controller 140 may control the operation (e.g., read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. For example, memory controller 140 may operate a selection component to isolate a digit line 115—e.g., from a corresponding capacitor—during sensing. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

As disclosed herein, a ferroelectric memory cell 105 that has been initialized to a logical state may be selected. A digit line 115 may increase to a threshold voltage that is to be used by the sense component 125. Prior to activation of the sense component 125, the capacitor used to store the logical state of the cell 105 may be isolated from the digit line 115. Thus, the memory cell's 105 capacitor may be prevented from being overcharged during a read operation, for example when higher read voltages are used. This type of sensing scheme may increase the signal sensed by a sense amplifier—without stressing the capacitor—and improve read operation accuracy.

Figure 2:
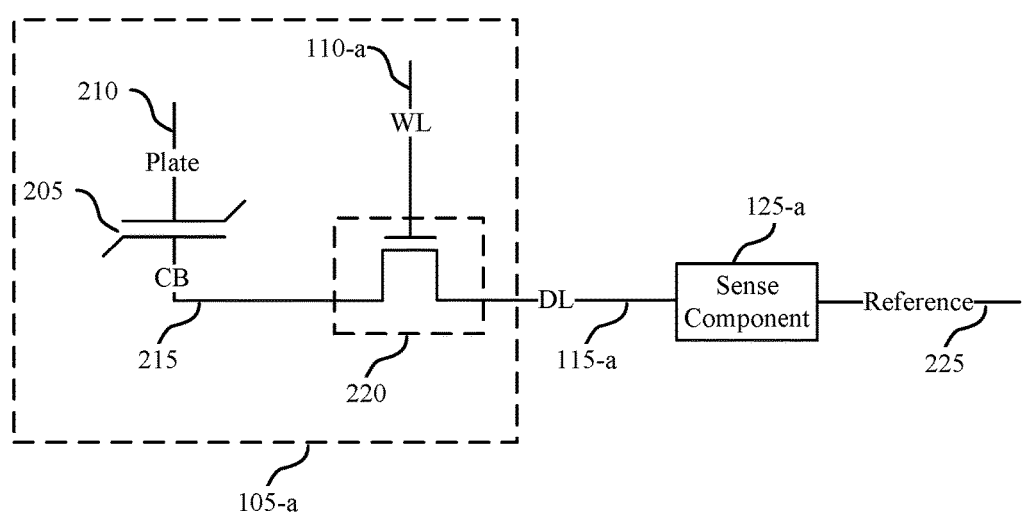
FIG. 2 illustrates an example circuit of a memory cell that supports memory cell sensing with storage component isolation in accordance with various embodiments of the present disclosure.

FIG. 2 illustrates an example circuit 200 that supports memory cell sensing with storage component isolation in accordance with various embodiments of the present disclosure. Circuit 200 includes a ferroelectric memory cell 105-a, word line 110-a, digit line 115-a, and sense component 125-a, which may be examples of a memory cell 105, word line 110, digit line 115, and sense component 125, respectively, as described with reference to FIG. 1. Circuit 200 may include a logic storage component, such as capacitor 205, which may include conductive terminals, including plate 210 and capacitor bottom 215. These terminals may be separated by an insulating ferroelectric material. As described above, various states may be stored by charging or discharging capacitor 205, i.e., polarizing the ferroelectric material of capacitor 205. The total charge need to polarize capacitor 205 may be referred to as the remnant polarization (PR) value, and a voltage of capacitor 205 at which half the total charge of capacitor 205 is reached may be referred to as the coercive voltage (VC).

The stored state of capacitor 205 may be read or sensed by operating various elements represented in circuit 200. Capacitor 205 may be in electronic communication with digit line 115-a. Capacitor 205 may thus be isolated from the digit line 115-a when selection component 220 is deactivated, and capacitor 205 may be connected to digit line 115-a via selection component 220 when selection component 220 is activated to select the ferroelectric memory cell 105-a. In other words, ferroelectric memory cell 105-a may be selected using selection component 220 that is in electronic communication with ferroelectric capacitor 205, where ferroelectric memory cell 105-a includes selection component 220 and ferroelectric capacitor 205. In some cases, selection component 220 may be a transistor and its operation may be controlled by applying a voltage (e.g., an activation voltage) to the transistor gate, where the voltage magnitude is greater than the threshold magnitude of the transistor. Word line 110-a may activate selection component 220; for example, a voltage applied to word line 110-a may be applied to the transistor gate, connecting capacitor 205 with digit line 115-a.

In the example depicted in FIG. 2, capacitor 205 is a ferroelectric capacitor. Due to the ferroelectric material between the plates of capacitor 205, and as discussed in more detail below, capacitor 205 may not discharge upon connection to digit line 115-a. Instead, plate 210 may be biased by an external voltage, resulting in a change in the stored charge on capacitor 205. The change in stored charge depends on the initial state of capacitor 205, i.e., whether the initial state stored a logic 1 or a logic 0. The change in stored charge may then be compared to a reference (e.g., a reference voltage) by sense component 125-a in order to determine the stored logic state in memory cell 105-a.

The specific sensing scheme or process may take many forms. In one example, digit line 115-a may have an intrinsic capacitance and develop a non-zero voltage as capacitor 205 charges or discharges in response to the voltage applied to plate 210. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of pF). The subsequent voltage of digit line 115-a may depend on the initial logic state of capacitor 205, and sense component 125-a may compare this voltage to a reference voltage provided by reference component 225. For example, a voltage may be applied to plate 210 and a voltage at capacitor bottom 215 may change in relation to the stored charge. The voltage at capacitor bottom 215 may be compared with a reference voltage at sense component 125-a, and a comparison to the reference voltage may indicate a change in the charge of capacitor 205 resulting from the applied voltage and thus indicate a logic state stored in memory cell 105-a. The relationship between charge and voltage in capacitor 205 is described in further detail with reference to FIG. 3.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of plate 210 and capacitor bottom 215 through digit line 115-a. To write a logic 0, plate 210 may be taken high, that is, a positive voltage may be applied, and capacitor bottom 215 may be taken low, i.e., connected to ground, virtually grounded, or negative voltage may be applied. The opposite process is performed to write a logic 1, i.e., plate 210 is taken low and capacitor bottom 215 is taken high. The voltages applied at plate 210 may be referred to as write voltages.

Figure 3:
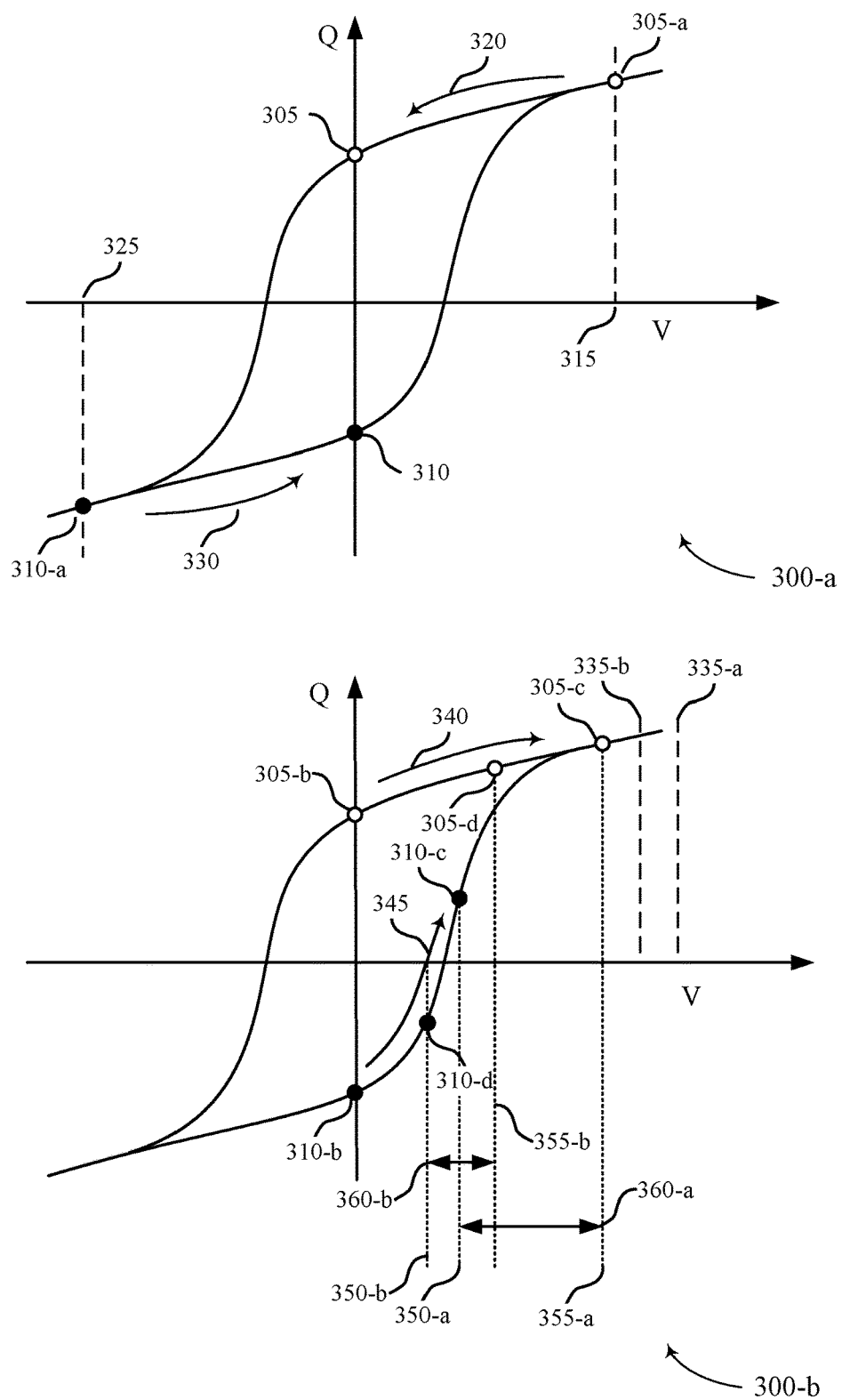
FIG. 3 illustrates example hysteresis curves for a ferroelectric memory cell that supports memory cell sensing with storage component isolation in accordance with various embodiments of the present disclosure.

Read and write operations of capacitor 205 may account for the non-linear properties associated with a ferroelectric device. FIG. 3 illustrates examples of such non-linear properties with hysteresis curves 300 for a ferroelectric memory cell that supports memory cell sensing with storage component isolation in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitors 205 of FIG. 2) as a function of a voltage, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge will accumulate at the terminal. Likewise, if the ferroelectric material has a positive polarization, negative charge will accumulate at the terminal. Additionally, it should be understood that the voltages in hysteresis curves 300 represent a voltage difference across the capacitor and are directional. For example, a positive voltage may be applied by applying a positive voltage to the terminal in question and maintaining the second terminal at ground. A negative voltage may be applied by maintaining the terminal in question at ground and applying a positive voltage to the second terminal, i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage potential. Similarly, charge state 310 is written by applying a net negative voltage 325, which results in charge state 310-*a*. After removing negative voltage 325, charge state 310-*a* follows path 330 until it reaches charge state 310 at zero voltage.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depending on whether charge state 305-*b* or 310-*b* was initially stored. For example, hysteresis curve 300-*b* illustrates two possible stored charge states 305-*b* and 310-*b*. Net voltage 335-*a* may be applied across the capacitor. Although depicted as a positive voltage, voltage 335-*a* may be negative. In response to voltage 335-*a*, charge state 305-*b* may follow path 340. Likewise, if charge state 310-*b* was initially stored, then it follows path 345. The final position of charge state 305-*c* and charge state 310-*c* depend on a number of factors, including the specific sensing operation and circuitry and the voltage applied across the capacitor. For example, if voltage 335-*b* is applied across the capacitor instead of voltage 335-*a*, charge state 305-*b* may follow path 340 to the final position of charge state 305-*c* rather than charge state 305-*d*. Similarly, charge state 310-*b* may follow path 345 to the final position of charge state 310-*c* rather than charge state 310-*d*.

In some cases, the final charge may depend on the intrinsic capacitance of the digit line of a memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* (or 305-*d* and 310-*d*) on hysteresis curve 300-*b* may thus depend on the capacitance of the digit line and may be determined through a load-line analysis, i.e., charge states 305-*c* and 310-*c* (or 305-*d* and 310-*d*) may be defined with respect to the digit line capacitance. As a result, the voltage of the capacitor, (e.g., voltage 350-*a* or 355-*a* when voltage 335-*a* is applied or voltage 350-*b* or 355-*b* when voltage 335-*b* is applied), may be different and may depend on the initial state of the capacitor. When the capacitor stores a logic 0, voltage 350-*a* and voltage 350-*b* may represent the voltage across the capacitor when voltage 335-*a* and voltage 335-*b* are applied, respectively. When the capacitor stores a logic 1, voltage 355-*a* and voltage 355-*b* may represent the voltage across the capacitor when voltage 335-*a* and voltage 335-*b* are applied, respectively.

By using the voltage of the capacitor (e.g., voltage 350-*a*, voltage 355-*a*, voltage 350-*b*, or voltage 355-*b*) in a comparison to a reference voltage, the initial state of the capacitor may be determined. For example, the reference voltage may be an average of the sum of the applied voltage 335 and voltage 350 and the sum of the applied voltage 335 and voltage 355. Upon comparison, the sensed voltage (e.g., the sum of the applied voltage 335 and voltage 350, or the sum of the applied voltage 335 and voltage 355) may be determined to be higher or lower than the reference voltage. A value of the ferroelectric cell (i.e., a logic 0 or 1) may then be determined based on the comparison.

In some cases there may not be much difference between voltage 350-*a* and voltage 355-*a* or voltage 350-*b* and voltage 355-*b*. In such scenarios, comparisons between the sensed voltage and the reference voltage may susceptible to error. As can be seen from hysteresis curve 300-*b*, the difference between the voltages 350 and 355 may be a function of the applied voltage 335. For example, the difference 360-*a* between voltage 350-*a* and voltage 355-*a*, which corresponds to a high read voltage 335-*a*, may be greater than the difference 360-*b* between voltage 350-*b* and voltage 355-*b*, which corresponds to a low voltage 335-*b*. Thus, increasing the voltage 335 applied to the cell may increase the difference between the voltages associated with charge states for a logic 1 and a logic 0, which may in turn reduce read errors. The difference 360 may be referred to as a sense or margin window.

Increasing the voltage 335 applied to the cell (e.g., during a read operation) may, however, cause the voltage across the capacitor (e.g., voltage 355-$a$) to exceed a threshold value. For instance, the maximum voltage of a range in which the capacitor is designed to perform, such as a breakdown voltage, may be exceeded if a larger read voltage is used and the sense amplifier activated. These relatively high voltages may stress the capacitor, which may damage the component, degrade performance, reduce longevity, or the like.

As discussed above, reading a memory cell 105 may degrade or destroy the stored logic. But a ferroelectric memory cell 105 may maintain the initial logic state after a read operation. For example, if charge state 305-$b$ is stored and the read operation performed, the charge state may return to initial charge state 305-$b$ after voltage 335 is removed, for example, by following path 340 in the opposite direction.

Figure 4:
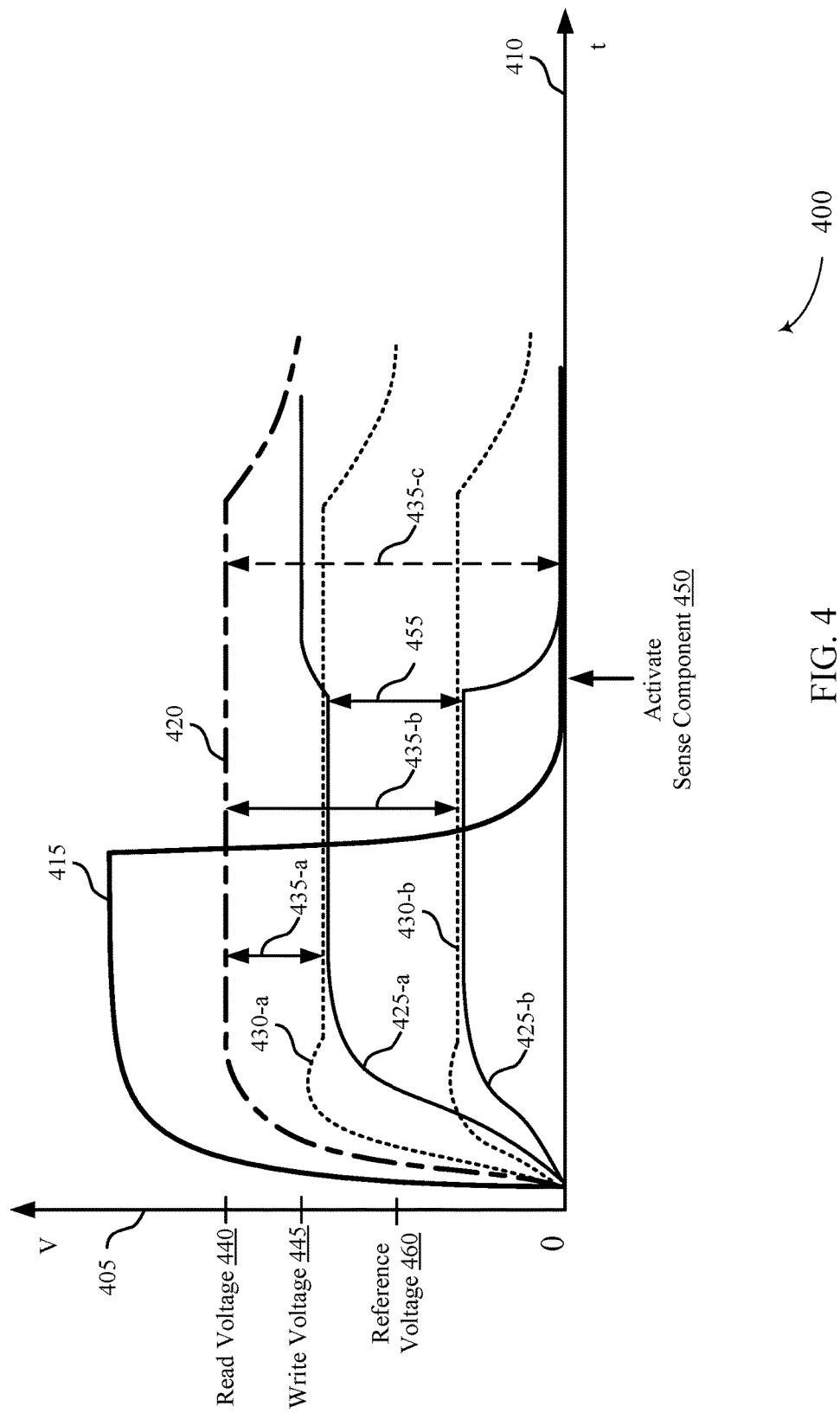
FIG. 4 illustrates a diagram for operating a ferroelectric memory cell that supports sensing with storage component isolation in accordance with various embodiments of the present disclosure.

FIG. 4 illustrates a timing diagram 400 for operating a ferroelectric memory cell that supports sensing with storage component isolation in accordance with various embodiments of the present disclosure. Timing diagram 400 includes voltage axis 405 and time axis 410 and may represent at least a portion of a read operation. The voltages of various components as a function of time are also represented on timing diagram 400. For example, timing diagram 400 includes word line voltage 415, plate voltage 420, digit line voltage 425-$a$, digit line voltage 425-$b$, capacitor bottom voltage 430-$a$, and capacitor bottom voltage 430-$b$.

By way of example, digit line voltage 425-$a$ may represent the voltage at the digit line of a cell when a digital 0 is stored and digit line voltage 425-$b$ represent the voltage of the digit line of the cell when a logic 1 is stored. Capacitor bottom voltage 430-$a$ may represent the voltage at the capacitor bottom when a logical 0 is stored (i.e., capacitor bottom voltage 430-$a$ may correspond to digit line voltage 425-$a$) and capacitor bottom voltage 430-$b$ may represent the voltage at the capacitor bottom when a logic 1 is stored (i.e., capacitor bottom voltage 430-$b$ may correspond to digit line voltage 425-$b$). Timing diagram 400 may result from operating circuit 200 described with reference to FIG. 2, and the following discussion is in the context of components depicted in FIG. 2.

As discussed above, various states can be stored by capacitor 205; capacitor 205 may be initialized to a first state or a second state. For example, capacitor 205 may be initialized to a first or second state by activating the selection component 220 and applying a voltage (e.g., a write voltage) to capacitor 205 (e.g., via word line 110-$a$). The application of the voltage to capacitor 205 may be based at least in part on the activation of the selection component 220. To read the state stored by capacitor 205, the voltage across capacitor 205 may be shared by the digit line (e.g., by activating the selection component 220), which in turn is sampled by the sense component 125-$a$. Activating selection component 220 may include applying an activation voltage to selection component 220; for example, cell 105-$a$ may be selected by applying word line voltage 415 to the gate of selection component 220. Activating selection component 220 may electrically connect capacitor bottom 215 to digit line 115-$a$ so that the digit line voltage 425 (e.g., digit line voltage 425-$a$ or digit line voltage 425-$b$) tracks the capacitor bottom voltage 430 (e.g., capacitor bottom voltage 430-$a$ or capacitor bottom voltage 430-$b$). The capacitor bottom voltage 430 may follow the path of the plate voltage 420 when it is applied, minus the voltage across capacitor 205, which represents a stored state).

The plate voltage 420 may be applied so that it reaches a threshold value (e.g., the read voltage 440). A threshold read value may be greater than a threshold write value used to write to the cell. Plate voltage 420 may be an example of applied voltage 355 described with reference to FIG. 2. Thus, when plate voltage 420 is applied to the cell plate 210, the voltage across the capacitor 205 may reach an equilibrium state or threshold value, which may correspond to a charge state 305 or 310, and thus to a logic 0 or 1, as described with reference to FIG. 2. For example, if a logic 0 was initially stored by capacitor 205, then the voltage across capacitor 205 during the read operation may be represented by capacitor voltage 435-$a$. Capacitor voltage 435-$a$ may be an example of a voltage 350 described with reference to FIG. 3. If a logic 1 was initially stored by capacitor 205, then the voltage across capacitor 205 during the read operation may be represented by capacitor voltage 435-$b$. Capacitor voltage 435-$b$ may be an example of a voltage 355 described with reference to FIG. 3. Sense window 455 may be an example of a difference 360 described with reference to FIG. 3

Once the digit line voltage 425 has stabilized, capacitor 205 may be isolated from the digit line 115-$a$; for example, word line voltage 415 may be changed so that selection component 220 is deactivated. Thus, isolation of capacitor 205 may be based on the determination that the digit line voltage has reached a threshold value. Isolation may include interrupting a connection between a terminal of capacitor 205 (e.g., capacitor bottom 215) and digit line 115-$a$. In the example of FIG. 4, the word line voltage 415 is dropped below a threshold value to deactivate selection component 220. Thus, isolating capacitor 205 may involve deactivating the word line 110-$a$ of selection component 220; however, other isolation techniques may be used. Capacitor 205 may be isolated from digit line 115-$a$ prior to the activation of sense component 125-$a$.

Activation 450 of sense component 125-$a$ may initiate a comparison of the digit line voltage 425 to a reference voltage 460 by sense component 125-$a$. In some examples, the reference voltage 460 may be substantially an average of the digit line voltage 425-$a$ and digit line voltage 425-$b$. The accuracy of the sense component 125-$a$ comparison may be a function of the size of sense window 455. For example, sense component 125-$a$ may be less likely to misread a stored logic state when the distance between the reference voltage 460 and the digit line 425 is large. In some cases, this distance may be increased by using a large sense window 455. Thus, sensing techniques that increase the size of the sense window 455—such as those described herein—may improve read accuracy when compared with sensing techniques that use a smaller sense window 455.

The digit line voltage 425 may be modified during the comparison process initiated by the activation 450 of sense component 125-$a$. For example, the digit line voltage 425-$a$ may be pulled to a first threshold voltage (e.g., the voltage used to write to capacitor 205) during operation of the activated sense component 125-$a$ and the digit line voltage 425-$b$ may be pulled to a second threshold voltage (e.g., ground). Because of the isolation of capacitor 205 from the digit line 115-$a$, the capacitor bottom voltage 430 may remain unchanged rather than following the digit line voltage 425. The capacitor bottom voltage 430 may thus be said to float. That is, the voltage across capacitor 205 may be maintained irrespective of the change in the digit line voltage 425. So when a logic 1 is stored by capacitor 205, the voltage across capacitor 205 after activation 450 of the sense component 125-a may be capacitor voltage 435-b instead of capacitor voltage 435-c. Maintaining a lower voltage across capacitor 205 may reduce stress on capacitor 205, which in turn may increase longevity of cell 105-a, as described above.

In some cases, the read operation shown in timing diagram 400 may destroy the initial state (e.g., the logic state) of capacitor 205. Therefore, cell 105-a may be re-selected, which may include re-applying the word line voltage 415, and capacitor 205 may be re-initialized to its original state, which may include applying a write voltage 445 to the plate 210.

Thus, timing diagram 400 illustrates isolation of a storage component (e.g., capacitor 205) from a corresponding digit line (and associated sense component) prior to the activation 450 of the sense component during a read operation. This type of timing scheme may allow the plate voltage applied during a read operation (e.g., read voltage 440) to be greater than a plate voltage applied during the write operation (e.g., write voltage 445) without causing stress to the cell.

In an alternative approach, stress on capacitor 205 may be prevented by modifying the plate voltage 420 rather than the word line voltage 415. For example, the plate voltage 420 may be lowered at substantially the same time that sense component 125-a is activated. Because the voltage across capacitor 205 may be a difference between the plate voltage 420 and the digit line voltage 425, lowering the plate voltage 420 as the digit line voltage 425 is modified by the sensing operation may prevent capacitor 205 from overcharging.

Figure 5:
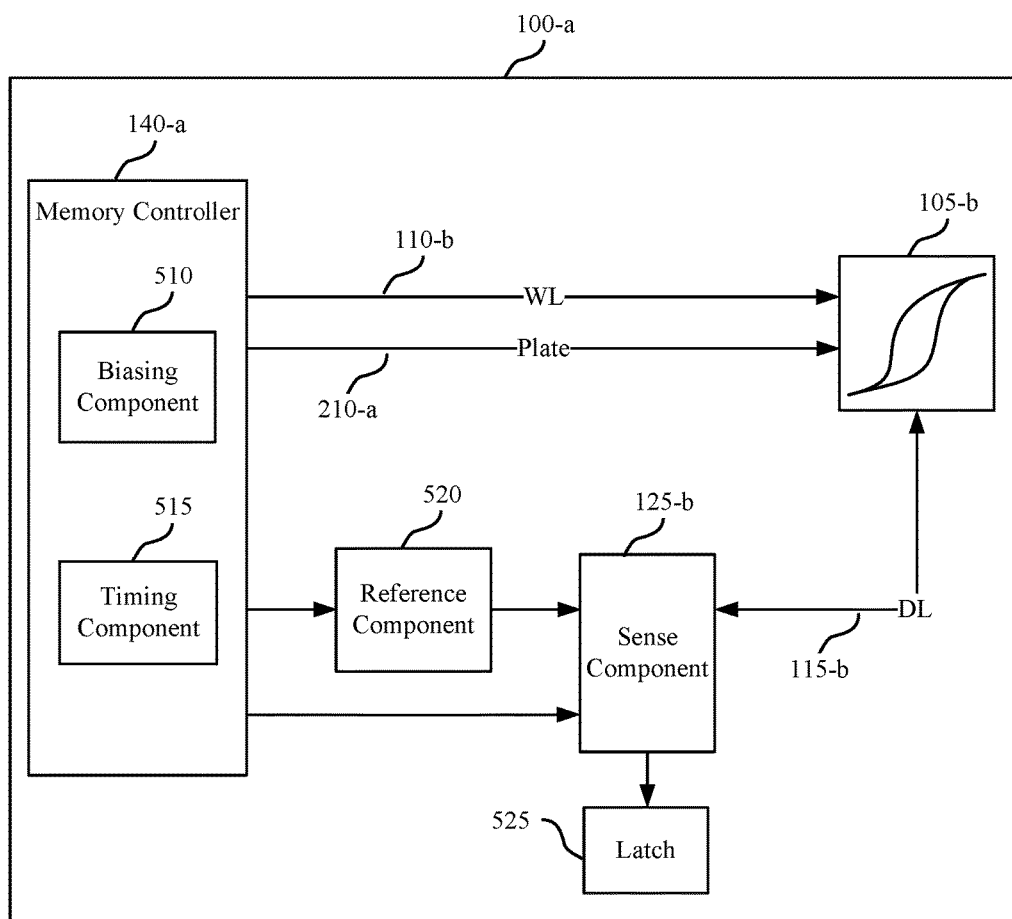
FIG. 5 illustrates a memory array that supports memory cell sensing with storage component isolation in accordance with various embodiments of the present disclosure.

FIG. 5 shows a block diagram 500 of memory array 100-a that supports memory cell sensing with storage component isolation in accordance with various embodiments of the present disclosure. Memory array 100-a may contain memory controller 140-a and memory cell 105-b, which may be examples of memory controller 140 and memory cell 105 described with reference to FIGS. 1 and 2. Memory controller 140-a may include biasing component 510 and timing component 515 and may operate memory array 100-a as described in FIGS. 1-4. Memory controller 140-a may be in electronic communication with word line 110-b, digit line 115-b, sense component 125-b, and plate 210-a, which may be examples of word line 110, digit line 115, sense component 125, and plate 210 described with reference to FIG. 1 or 2. Memory array 100-a may also include reference component 520 and latch 525. The components of memory array 100-a may be in electronic communication with one another and may perform the functions described with reference to FIGS. 1-4. In some cases, reference component 520, sense component 125-b, and latch 525 may be components of memory controller 140-a.

Memory controller 140-a may be configured to activate word line 110-b, plate 210-a, or digit line 115-b by applying voltages to those various nodes. For example, biasing component 510 may be configured to apply a voltage to operate memory cell 105-a to read or write memory cell 105-a as described above. In some cases, memory controller 140-a may include a row decoder, column decoder, or both, as described with reference to FIG. 1. This may enable memory controller 140-a to access one or more memory cells 105. In some cases, memory controller 140-a may be in electronic communication with a selection component and may be operable to select a cell through the selection component. The memory controller 140-a may also be operable to deselect the cell through the selection component to isolate a corresponding capacitor from a corresponding sense component (e.g., sense component 125-b). In some cases, the memory controller 140-a may activate the sense component while the capacitor is isolate from the sense component.

Biasing component 510 may also apply voltages to reference component 520 in order to generate a reference signal for sense component 125-b. Additionally, biasing component 510 may apply voltages for the operation of sense component 125-b. Biasing component 510 may communicate or collaborate with timing component 515.

Biasing component 510 may facilitate the application of a voltage to a word line 110-b of a selection component that is in electronic communication with a ferroelectric capacitor. For example, biasing component 510 may control the duration and magnitude of voltages applied to word line 110-b. Biasing component 510 may also facilitate the reduction of the word line 110-b voltage to a first threshold value. The first threshold value may be a voltage value which deactivates a selection component corresponding to word line 110-b. In some cases, the reduction may be based on the voltage of the word line 110-b reaching, or dropping below, the first threshold value and may be initiated by the timing component 515. In some examples, the biasing component may facilitate the re-application of the voltage to the word line of the selection component. The biasing component 510 may also facilitate the application of a voltage to the capacitor. The application may be based on the application of the voltage to the word line 110-b and may be initiated by the timing component 515. In some cases, application may be based on the re-application of the voltage to the word line 110-b.

In some cases, memory controller 140-a may perform its operations using timing component 515. For example, timing component 515 may control the timing of the various word line 110-b selections or plate 210-a biasing, including timing for switching and voltage application to perform the memory functions, such as reading and writing, discussed herein. For example, the timing component 515 may determine that the voltage of a digit line has reached a threshold value and facilitate isolation of a corresponding capacitor based at least in part on the determination (e.g., by communicating with biasing component 510). Timing component 515 may also facilitate the activation of an associated sense component (e.g., sense component 125-b) after the capacitor has been isolated. In this or other examples, timing component 515 may determine when a cell is to be re-selected (e.g., for re-initialization of the cell). For instance, the timing component 515 may detect the activation of the sense component and initiate the reselection of the cell based on the detection.

In some examples, timing component 515 may determine that a word line 110-b voltage has reached a first threshold and facilitate the isolation of the capacitor from the sense component based at least in part on the determination. The timing component 515 may determine that the voltage of the digit line has reached a second threshold value for a threshold time and facilitate the reduction of the word line 110-b voltage based at least in part on the determination. In this or other cases, the timing component 515 may initiate the application of a voltage to the capacitor based on the application of a voltage to the word line.

In some examples, the timing component 515 may facilitate application of a voltage to the capacitor based on the re-application of the voltage to the word line. The timing component 515 may also initiate application of a first voltage to the capacitor after application of the voltage to the word line and before the sense component is isolated. In this or other examples, the timing component 515 may facilitate the reduction of the first voltage to a second voltage after a comparison of the sense component voltage to a reference voltage. The second voltage may be equal to the voltage of the sense component. In some scenarios, the timing component 515 may determine a timing of the comparison based on physical characteristics of the cell. In some cases, timing component 515 may control the operations of biasing component 510.

Reference component 520 may include various components to generate a reference signal for sense component 125-b. Reference component 520 may include circuitry specifically configured to produce a reference signal. In some cases, reference component 520 may be other ferroelectric memory cells 105. In some examples, reference component 520 may be configured to output a voltage with a value between the two sense voltages, as described with reference to FIG. 3. Or reference component 520 may be designed to output a virtual ground voltage (i.e., approximately 0V).

Sense component 125-b may compare a signal from memory cell 105-b, through digit line 115-b, with a reference signal from reference component 520. Upon determining the logic state, the sense component may then store the output in latch 525, where it may be used in accordance with the operations of an electronic device using the memory device of which memory array 100-a is a part. In some cases, sense component 125-b is a sense amplifier.

Figure 6:
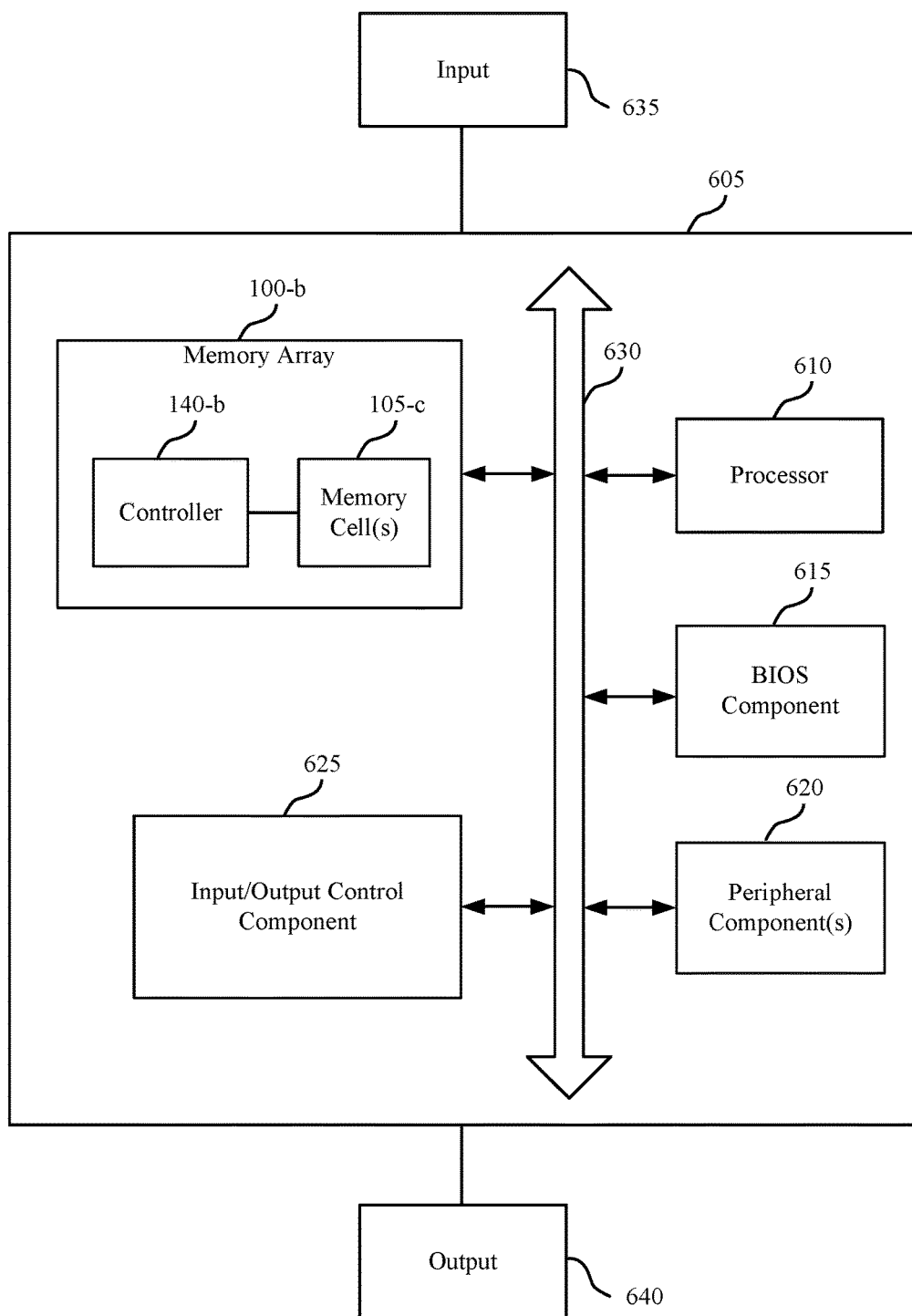
FIG. 6 illustrates a system, including a memory array, that supports memory cell sensing with digit line isolation in accordance with various embodiments of the present disclosure.

FIG. 6 illustrates a system 600 that supports memory cell sensing with storage component isolation in accordance with various embodiments of the present disclosure. System 600 includes a device 605, which may be or include a printed circuit board to connect or physically support various components. Device 605 includes a memory array 100-b, which may be an example of memory array 100 described with reference to FIG. 1 and FIG. 5. Memory array 100-b may contain memory controller 140-b and memory cell(s) 105-c, which may be examples of memory controller 140 described with reference to FIGS. 1 and 5 and memory cells 105 described with reference to FIGS. 1, 2, and 5. Device 605 may also include a processor 610, BIOS component 615, peripheral component(s) 620, and input/output control component 625. The components of device 605 may be in electronic communication with one another through bus 630.

Processor 610 may be configured to operate memory array 100-b through memory controller 140-b. In some cases, processor 610 may perform the functions of memory controller 140 described with reference to FIGS. 1 and 5. In other cases, memory controller 140-b may be integrated into processor 610. Processor 610 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 610 may perform various functions described herein, including isolation of a storage component from its corresponding digit line prior to activation of a sense component (e.g., a sense amplifier). Processor 610 may, for example, be configured to execute computer-readable instructions stored in memory array 100-b to cause device 605 perform various functions or tasks.

BIOS component 615 may be a software component that includes a basic input/output system (BIOS) operated as firmware, which may initialize and run various hardware components of system 600. BIOS component 615 may also manage data flow between processor 610 and the various components, e.g., peripheral components 620, input/output control component 625, etc. BIOS component 615 may include a program or software stored in read-only memory (ROM), flash memory, or any other non-volatile memory.

Peripheral component(s) 620 may be any input or output device, or an interface for such devices, that is integrated into device 605. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 625 may manage data communication between processor 610 and peripheral component(s) 620, input 635 devices, or output 640 devices. Input/output control component 625 may also manage peripherals not integrated into device 605. In some cases, input/output control component 625 may represent a physical connection or port to the external peripheral.

Input 635 may represent a device or signal external to device 605 that provides input to device 605 or its components. This may include a user interface or interface with or between other devices. In some cases, input 635 may be a peripheral that interfaces with device 605 via peripheral component(s) 620 or may be managed by input/output control component 625.

Output 640 device may represent a device or signal external to device 605 configured to receive output from device 605 or any of its components. Examples of output 640 device may include a display, audio speakers, a printing device, another processor or printed circuit board, etc. In some cases, output 640 may be a peripheral that interfaces with device 605 via peripheral component(s) 620 or may be managed by input/output control component 625.

The components of memory controller 140-b, device 605, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 7:
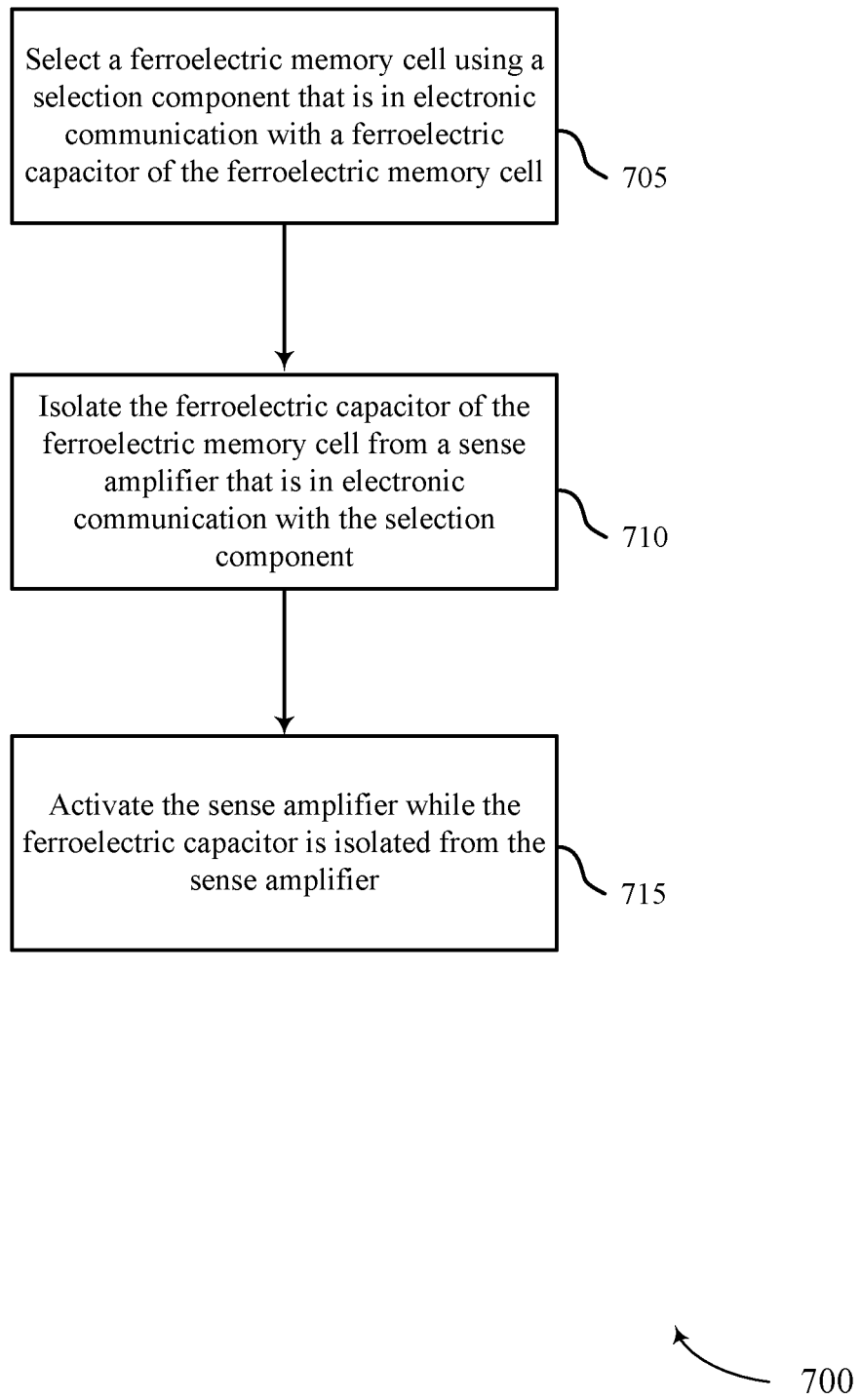
FIGS. 7 and 8 are flowcharts that illustrate a method or methods for memory cell sensing with digit line isolation in accordance with various embodiments of the present disclosure.

FIG. 7 shows a flowchart illustrating a method 700 for memory cell sensing with digit line isolation in accordance with various embodiments of the present disclosure. The operations of method 700 may be implemented by a memory array 100, as described with reference to FIGS. 1-6. For example, the operations of method 700 may be performed by a memory controller 140, as described with reference to FIGS. 1, 5, and 6. In some examples, a memory controller 140 may execute a set of codes to control the functional elements of the memory array 100 to perform the functions described below. Additionally or alternatively, the memory controller 140 may perform aspects the functions described below using special-purpose hardware.

At block 705, the method may include selecting a ferroelectric memory cell using a selection component that is in electronic communication with a ferroelectric capacitor of the ferroelectric memory cell, as described with reference to FIGS. 1-6. In some cases, selecting the ferroelectric memory cell includes activating a word line of the selection component. Prior to the selection, the ferroelectric capacitor may be initialized to a first state or a second state. In certain examples, the operations of block 705 may be performed or facilitated by the biasing component 510, as described with reference to FIGS. 5 and 6.

At block 710, the method may include isolating the ferroelectric capacitor of the ferroelectric memory cell from a sense amplifier that is in electronic communication with the selection component, as described with reference to FIGS. 1-6. In some cases, it may be determined that a voltage of a digit line between the selection component and the sense amplifier has reached a threshold value. In such cases, the ferroelectric capacitor may be isolated based at least in part on the determination. In some examples, isolating the ferroelectric capacitor includes interrupting a connection between a terminal (e.g., the capacitor bottom) of the ferroelectric capacitor and the digit line of the selection component. For example, the ferroelectric capacitor may be isolated by deactivating the word line of the selection component. In certain examples, the operations of block 710 may be performed or facilitated by the biasing component 510 as described with reference to FIGS. 5 and 6.

At block 715, the method may include activating the sense amplifier while the ferroelectric capacitor is isolated from the sense amplifier as described with reference to FIGS. 1-6. In some cases, the sense amplifier is activated after the ferroelectric capacitor is isolated. Activating the sense amplifier may include modifying a voltage of the digit line between the selection component and the sense amplifier. In some cases, a voltage across the ferroelectric capacitor may be maintained irrespective of the voltage of the digit line after activation of the sense amplifier. In some examples, activating the sense amplifier may be followed by reselection of the ferroelectric memory cell. In such cases, the reselection may be based on the activation of the sense amplifier. Additionally, the ferroelectric capacitor may be re-initialized to the first or second state. In certain examples, the operations of block 715 may be performed or facilitated by the biasing component 510 as described with reference to FIGS. 5 and 6.

Figure 8:
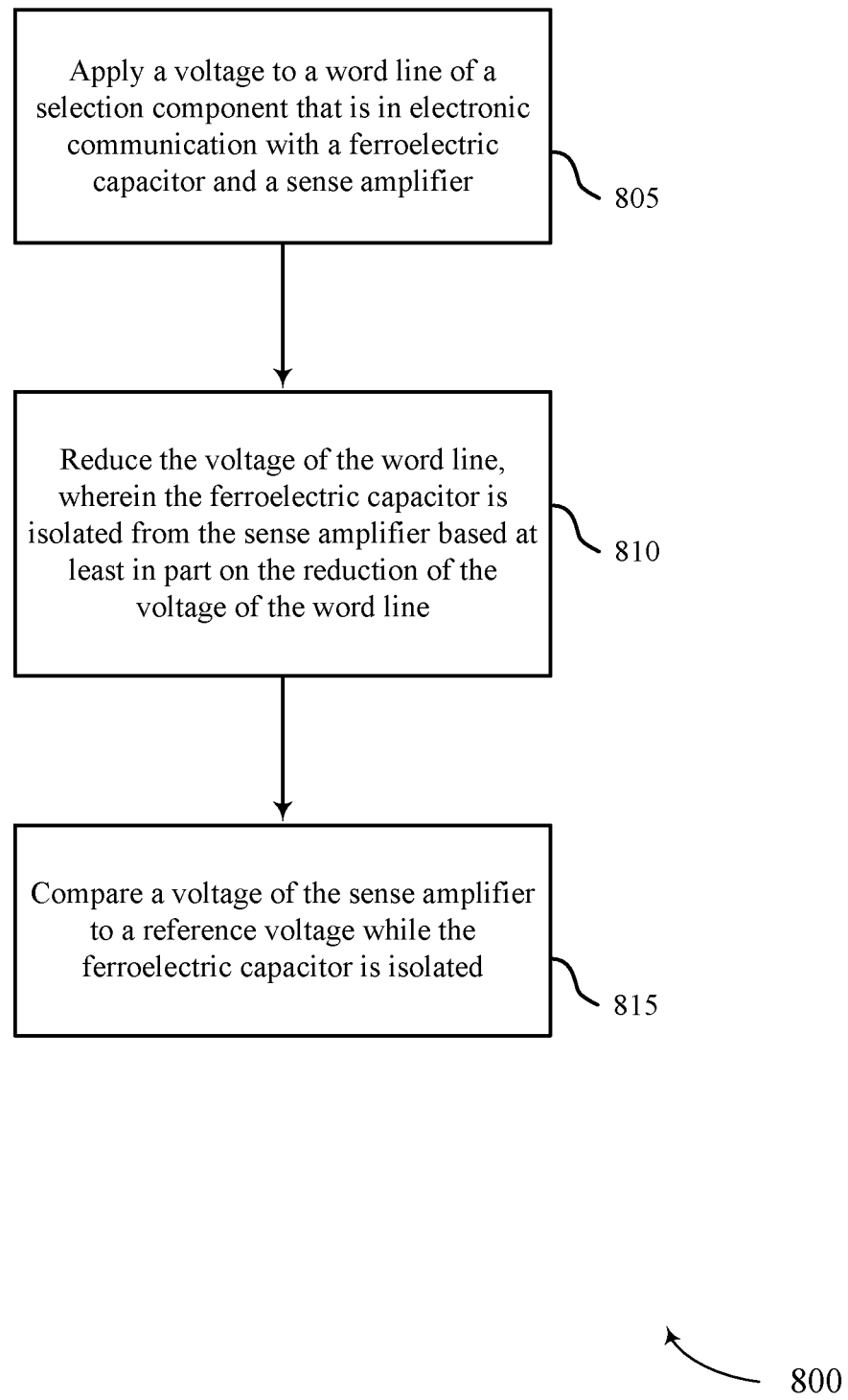

FIG. 8 shows a flowchart illustrating a method 800 for memory cell sensing with digit line isolation in accordance with various embodiments of the present disclosure. The operations of method 800 may be implemented by a memory array 100, as described with reference to FIGS. 1-6. For example, the operations of method 800 may be performed by a memory controller 140, as described with reference to FIGS. 1, 5, and 6. In some examples, a memory controller 140 may execute a set of codes to control the functional elements of the memory array 100 to perform the functions described below. Additionally or alternatively, the memory controller 140 may perform aspects the functions described below using special-purpose hardware.

At block 805, the method may include applying a voltage to a word line of a selection component that is in electronic communication with a ferroelectric capacitor and a sense amplifier, as described with reference to FIGS. 1-6. In some examples, a voltage may be applied to the ferroelectric capacitor (e.g., to the plate) based at least in part on the application of the voltage to the word line. In some cases, the ferroelectric capacitor may be initialized to a first or second state prior to application of the voltage. In such scenarios, a voltage may be applied to the word line and a voltage (e.g., a write voltage) may be applied to the ferroelectric capacitor (e.g., at the plate). In certain examples, the operations of block 805 may be performed or facilitated by the biasing component 510, as described with reference to FIGS. 5 and 6.

At block 810, the method may include reducing the voltage of the word line (e.g., to a first threshold value, such as a deactivation value). The ferroelectric capacitor may be isolated from the sense amplifier based at least in part on the reduction of the voltage of the word line (e.g., the ferroelectric capacitor may be isolated based at least in part on the voltage reaching the first threshold value), as described with reference to FIGS. 1-6. In some examples, it may be determined that the digit line voltage of the selection component has reached a second threshold value for a threshold time. In such a scenario, the reduction of the word line voltage may be based at least in part on the determination that the digit line voltage has reached the second threshold value. The voltage of the selection component digit line may be maintained irrespective of the reduction of the voltage of the word line. In some cases, a first voltage may be applied to the ferroelectric capacitor (e.g., at the plate) after the application of the voltage to the word line and before the sense amplifier is isolated. In such cases, the first voltage maybe modified (e.g., reduced) to a second voltage after comparing the voltage of the sense amplifier to the reference voltage. The second voltage may be equal to the voltage of the sense amplifier. In certain examples, the operations of block 810 may be performed or facilitated by the biasing component 510, as described with reference to FIGS. 5 and 6.

At block 815, the method may include comparing a voltage of the sense amplifier to a reference voltage while the ferroelectric capacitor is isolated, as described with reference to FIGS. 1-6. In some examples, the timing for the comparison may be based at least in part on a physical characteristic of the ferroelectric memory cell. In certain examples, the operations of block 815 may be performed or facilitated by the biasing component 510, as described with reference to FIGS. 5 and 6.

Thus, methods 700 and 800 may provide for memory cell sensing with storage component isolation. It should be noted that methods 700 and 800 describe possible implementations, and the operations and steps may be rearranged or otherwise modified such that other implementations are possible. In some examples, aspects from two or more of the methods 700 and 800 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed). The term "isolated" refers to a relationship between components that does not support electron flow between components. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of operating a ferroelectric memory cell, comprising:
   selecting the ferroelectric memory cell using a selection component that is in electronic communication with a ferroelectric capacitor of the ferroelectric memory cell;
   determining that a voltage of a digit line between the selection component and a sense amplifier has reached a threshold value;
   isolating the ferroelectric capacitor of the ferroelectric memory cell from a sense amplifier that is in electronic communication with the selection component, wherein the ferroelectric capacitor is isolated based at least in part on the determination;
   activating the sense amplifier while the ferroelectric capacitor is isolated from the sense amplifier; and
   reducing a voltage of the ferroelectric capacitor of the ferroelectric memory cell while the sense amplifier is activated.

2. The method of claim 1, wherein selecting the ferroelectric memory cell using the selection component comprises activating a word line of the selection component, and wherein isolating the ferroelectric capacitor comprises deactivating the word line.

3. The method of claim 1, wherein isolating the ferroelectric capacitor comprises:
   interrupting a connection between a terminal of the ferroelectric capacitor and digit line of the selection component.

4. The method of claim 1, wherein activating the sense amplifier comprises:
   modifying a voltage of a digit line between the selection component and the sense amplifier; and
   maintaining a voltage across the ferroelectric capacitor irrespective of the voltage of the digit line.

5. The method of claim 1, further comprising:
   initializing the ferroelectric capacitor to a first state or a second state.

6. The method of claim 1, further comprising:
   reselecting the ferroelectric memory cell, wherein the reselection is based at least in part on the activation of the sense amplifier; and
   re-initializing the ferroelectric capacitor to a first state or a second state.

7. The method of claim 1, wherein the sense amplifier is activated after the ferroelectric capacitor is isolated.

8. A method of operating a ferroelectric memory cell comprising a ferroelectric capacitor and a selection component, the method comprising:
   applying a voltage to a word line of the selection component, wherein the selection component is in electronic communication with the ferroelectric capacitor and a sense amplifier;
   applying a voltage to the ferroelectric capacitor, wherein the voltage is applied to the ferroelectric capacitor based at least in part on the application of the voltage to the word line;
   reducing the voltage of the word line, wherein the ferroelectric capacitor is isolated from the sense amplifier based at least in part on the reduction of the voltage of the word line;
   determining that a voltage of a digit line of the selection component has reached a threshold value for a threshold time, wherein the voltage of the word line is reduced based at least in part on determining that the voltage of the digit line has reached the threshold value;
   comparing a voltage of the sense amplifier to a reference voltage while the ferroelectric capacitor is isolated; and
   reducing the voltage of the ferroelectric capacitor based at least in part on the comparison.

9. The method of claim 8, further comprising:
   applying a voltage to the ferroelectric capacitor based at least in part on the application of the voltage to the word line.

10. The method of claim 8, further comprising:
    maintaining a voltage of a digit line of the selection component irrespective of the reduction of the voltage of the word line.

11. The method of claim 8, further comprising:
    activating the selection component; and
    applying a voltage to the ferroelectric capacitor based at least in part on the activation of the selection component, wherein applying the voltage to the ferroelectric capacitor initializes the ferroelectric capacitor to a first state or a second state.

12. The method of claim 8, further comprising:
    re-applying the voltage to the word line of the selection component; and
    applying a voltage to the ferroelectric capacitor based at least in part on the re-application of the voltage to the word line, wherein applying the voltage to the ferroelectric capacitor restores the ferroelectric capacitor to a first state or a second state.

13. The method of claim 8, further comprising:
    applying a first voltage to the ferroelectric capacitor after the application of the voltage to the word line and before the sense amplifier is isolated; and
    reducing the first voltage to a second voltage after comparing the voltage of the sense amplifier to the reference voltage.

14. The method of claim 8, further comprising:
    determining a timing for comparing the voltage of the sense amplifier to the reference voltage based at least in part on a physical characteristic of the ferroelectric memory cell.

15. A method of operating a ferroelectric memory cell comprising a ferroelectric capacitor and a selection component, the method comprising:
    applying a voltage to a word line of the selection component, wherein the selection component is in electronic communication with the ferroelectric capacitor and a sense amplifier;
    reducing the voltage of the word line, wherein the ferroelectric capacitor is isolated from the sense amplifier based at least in part on the reduction of the voltage of the word line;
    comparing a voltage of the sense amplifier to a reference voltage while the ferroelectric capacitor is isolated;

applying a first voltage to the ferroelectric capacitor after the application of the voltage to the word line and before the sense amplifier is isolated; and reducing the first voltage to a second voltage after comparing the voltage of the sense amplifier to the reference voltage, wherein the second voltage is equal to the voltage of the sense amplifier.

16. An electronic memory apparatus, comprising:

a ferroelectric memory cell that comprises a ferroelectric capacitor in electronic communication with a selection component;

a sense amplifier in electronic communication with the selection component; and a controller in electronic communication with the selection component and the sense amplifier, wherein the controller is operable to:

select the ferroelectric memory cell through the selection component;

determine that a voltage of a digit line between the selection component and the sense amplifier has reached a threshold value;

deselect the ferroelectric memory cell through the selection component to isolate the ferroelectric capacitor from the sense amplifier, wherein the ferroelectric capacitor is deselected based at least in part on the determination;

activate the sense amplifier while the ferroelectric capacitor is isolated from the sense amplifier; and reduce a voltage of the ferroelectric capacitor of the ferroelectric memory cell while the sense amplifier is activated.

17. The electronic memory apparatus of claim 16, wherein the selection component comprises a transistor and a digit line in electronic communication with the sense amplifier, and wherein the controller is operable to:

activate a word line of the transistor to select the ferroelectric memory cell; and deactivate the word line of the transistor to deselect the ferroelectric capacitor when a voltage of the digit line reaches a threshold value.

18. The electronic memory apparatus of claim 16, wherein the controller is operable to:

compare a voltage of the sense amplifier to a reference voltage while the ferroelectric capacitor is isolated, wherein a timing for the comparison is based at least in part on a physical characteristic of the ferroelectric memory cell.

* * * * *